United States Patent
Fan (10) Patent No.: US 11,038,320 B2
(45) Date of Patent: Jun. 15, 2021

(54) SEMICONDUCTOR LAYER STRUCTURE WITH A THICK BUFFER LAYER

(71) Applicant: Lumentum Operations LLC, Milpitas, CA (US)

(72) Inventor: Li Fan, Milpitas, CA (US)

(73) Assignee: Lumentum Operations LLC, San Jose, CA (US)

( * ) Notice: Subject to any disclaimer, the term of this patent is extended or adjusted under 35 U.S.C. 154(b) by 0 days.

(21) Appl. No.: 16/423,820

(22) Filed: May 28, 2019

(65) Prior Publication Data
US 2020/0067280 A1 Feb. 27, 2020

Related U.S. Application Data

(60) Provisional application No. 62/721,346, filed on Aug. 22, 2018.

(51) Int. Cl.
| | | |
|---|---|---|
| *H01S 5/16* | (2006.01) | |
| *H01S 5/34* | (2006.01) | |
| *H01S 5/323* | (2006.01) | |
| *H01S 5/343* | (2006.01) | |

(52) U.S. Cl.
CPC ............ *H01S 5/162* (2013.01); *H01S 5/3235* (2013.01); *H01S 5/34* (2013.01); *H01S 5/3413* (2013.01); *H01S 5/343* (2013.01); *H01S 2301/173* (2013.01)

(58) Field of Classification Search
CPC . H01S 5/34; H01S 5/162; H01S 5/026; H01S 2301/173; H01S 5/3235; H01S 5/3413
See application file for complete search history.

(56) References Cited

U.S. PATENT DOCUMENTS

| | | | | |
|---|---|---|---|---|
| 5,703,894 A * | 12/1997 | Valster | ................... | B82Y 20/00 257/E21.086 |
| 5,717,707 A * | 2/1998 | Beernink | ............... | B82Y 20/00 372/45.01 |
| 5,977,612 A * | 11/1999 | Bour | ...................... | B82Y 20/00 257/103 |
| 6,144,683 A * | 11/2000 | Floyd | ..................... | B82Y 20/00 372/45.01 |
| 6,172,382 B1 * | 1/2001 | Nagahama | ............. | B82Y 20/00 257/103 |
| 2002/0014674 A1 * | 2/2002 | Hideyoshi | ........... | H01L 33/0045 257/458 |

(Continued)

OTHER PUBLICATIONS

Nick Holonyak, Jr., "Impurity-Induced Layer Disordering of Quantum-Well Heterostructures: Discovery and Prospects", Jul./Aug. 1998, 11 Pages.

(Continued)

*Primary Examiner* — Yuanda Zhang
(74) *Attorney, Agent, or Firm* — Harrity & Harrity, LLP (57) ABSTRACT

A semiconductor layer structure may include a substrate, a buffer layer formed on the substrate, and a set of epitaxial layers formed on the buffer layer. The buffer layer may have a thickness that is greater than 2 micrometers ($\mu$m). The set of epitaxial layers may include a quantum well layer. A quantum well intermixing region may be formed in association with the quantum well layer and a material diffused from a region of a surface of the semiconductor layer structure.

20 Claims, 5 Drawing Sheets

(56) References Cited

U.S. PATENT DOCUMENTS

| | | | |
|---|---|---|---|
| 2002/0018288 A1* | 2/2002 | Rieger | H01S 3/0606 |
| | | | 359/342 |
| 2002/0036293 A1* | 3/2002 | Hayakawa | H01S 5/34333 |
| | | | 257/79 |
| 2003/0042492 A1* | 3/2003 | Watanabe | H01S 5/162 |
| | | | 257/79 |
| 2005/0069004 A1* | 3/2005 | Watanabe | B82Y 20/00 |
| | | | 372/49.01 |
| 2010/0244040 A1* | 9/2010 | Yokoyama | B82Y 20/00 |
| | | | 257/76 |

OTHER PUBLICATIONS

I. Harrison, "Review Impurity-induced disordering in III-V multi-quantum wells and superlattices", Mar. 1993, 28 pages.

* cited by examiner

SEMICONDUCTOR LAYER STRUCTURE WITH A THICK BUFFER LAYER

RELATED APPLICATION

This application claims priority under 35 U.S.C. § 119 to U.S. Provisional Patent Application No. 62/721,346, filed on Aug. 22, 2018, the content of which is incorporated by reference herein in its entirety.

TECHNICAL FIELD

The present disclosure relates to an emitter array and, more particularly, to a semiconductor layer structure with a thick buffer layer.

BACKGROUND

A semiconductor laser is formed from various epitaxial layers. The various epitaxial layers are grown on a substrate. The semiconductor laser lases when supplied with electric current. A semiconductor laser may include an edge emitting laser or a vertical emitting laser, such as a vertical cavity surface emitting laser (VCSEL).

SUMMARY

According to some implementations, a semiconductor layer structure may include: a substrate; a buffer layer formed on the substrate; and a set of epitaxial layers formed on the buffer layer, wherein the buffer layer has a thickness that is greater than 2 micrometers (μm), wherein the set of epitaxial layers includes a quantum well layer, and wherein a quantum well intermixing region is formed in association with the quantum well layer and a material diffused from a region of a surface of the semiconductor layer structure.

According to some implementations, a semiconductor laser may include: a substrate; a buffer layer formed on the substrate; and a set of epitaxial layers formed on the buffer layer, wherein the buffer layer has a thickness that is between 3 micrometers (μm) and 5 μm, wherein the set of epitaxial layers includes a quantum well layer, and wherein a quantum well intermixing region is formed within the quantum well layer by a material diffused from a region of a surface of a semiconductor layer structure using quantum well intermixing.

According to some implementations, an optical device may include: a substrate; a buffer layer formed on the substrate; and a set of epitaxial layers formed on the buffer layer, wherein the buffer layer has a thickness that averages 4 micrometers (μm) across the buffer layer, wherein the set of epitaxial layers includes a quantum well layer, and wherein a quantum well intermixing region is formed within the quantum well layer by a material diffused from a region of a surface of a semiconductor layer structure using quantum well intermixing, wherein the clad layer is formed on the buffer layer.

According to some implementations, a method may include: providing a substrate; forming a buffer layer on the substrate, wherein the buffer layer has a thickness that is greater than 2 micrometers (μm); and forming a set of epitaxial layers on the buffer layer, wherein the set of epitaxial layers includes a quantum well layer, and wherein a quantum well intermixing region is formed in association with the quantum well layer and a material diffused from a region of a surface of the semiconductor layer structure.

DETAILED DESCRIPTION

The following detailed description of example implementations refers to the accompanying drawings. The same reference numbers in different drawings may identify the same or similar elements.

Impurity-induced disordering can be used to produce a high-power diode laser. During this process, a wafer is placed in a high temperature environment until a quantum well is intermixed. However, quantum well intermixing happens not only in the region where the quantum well intermixing is intended to occur, but also in an active region of a semiconductor layer structure of the diode laser where quantum well intermixing is detrimental. The result of this process is significant wafer-by-wafer lasing wavelength variation, which can cause low yield for a given wavelength specification. Significant wavelength variation with substrate slice number from the same boule has been observed (e.g., wafers from a same boule can experience a wavelength variation of 30 nanometers (nm) or more, depending on the slice number of the wafers from the boule). For example, in the same growth run, a wafer with a low substrate slice number usually has much shorter lasing wavelength (e.g., in the range of 850 nm to 865 nm) than a wafer with a high substrate slice number (e.g., which can have a lasing wavelength in the range of 875 nm to 895 nm). Impurities or point defects (e.g., vacancies, where an atom is missing in the lattice of the crystal) are present in substrates and tend to migrate towards the epitaxial layers of a semiconductor layer structure during the growth process and other wafer thermal treatment, especially during an impurity-induced disordering process step. This migration of impurities or point defects facilitates quantum well intermixing causing the lasing wavelength to deviate from a designed wavelength.

A barrier between the substrate and epitaxial layers is needed to block and/or reduce this migration. A buffer layer, separating the epitaxial layers from the substrate, plays a critical role in the epitaxial growth quality. Since even the most meticulous substrate preparation cannot provide an atomically smooth surface, which becomes even rougher during the initial "oxide blow-off," the buffer layer facilitates a smooth interface for the epitaxial growth. The epitaxial structures of near-IR semiconductor lasers are usually grown on GaAs substrates after a thin GaAs buffer layer is grown. In the semiconductor layer structure mentioned above, the thickness of the buffer layer is typically about 0.4 micrometers (μm) (or about 400 nm).

Some implementations described herein provide a semiconductor layer structure (e.g., for a semiconductor diode laser) that includes a thick buffer layer. For example, the thick buffer layer may separate a substrate of the semiconductor layer structure and various epitaxial layers of the semiconductor layer structure (e.g., the various epitaxial layers may be associated with lasing when the semiconductor layer structure is included in a semiconductor laser). The thick buffer layer may have a multiple micron (μall) thickness that prevents or blocks impurities or point defects from migrating from the substrate into the various epitaxial layers. This provides improved control of lasing wavelength across semiconductor lasers produced from different wafers by reducing or eliminating quantum well intermixing in un-intended areas of the semiconductor layer structure, thereby reducing or eliminating wavelength variability across different semiconductor lasers and/or reducing a likelihood that a wavelength for a semiconductor laser formed from the semiconductor layer structure will have a lasing wavelength outside of a designed wavelength range. Improved control of lasing wavelength improves production yield of producing semiconductor lasers from a boule by providing improved control of lasing wavelength within a range of wavelengths across different semiconductor lasers formed from different wafers of a boule. Improved yield reduces costs and eliminates waste that would otherwise occur through use of a semiconductor layer structure that does not include a thick buffer layer.

Figure 1:
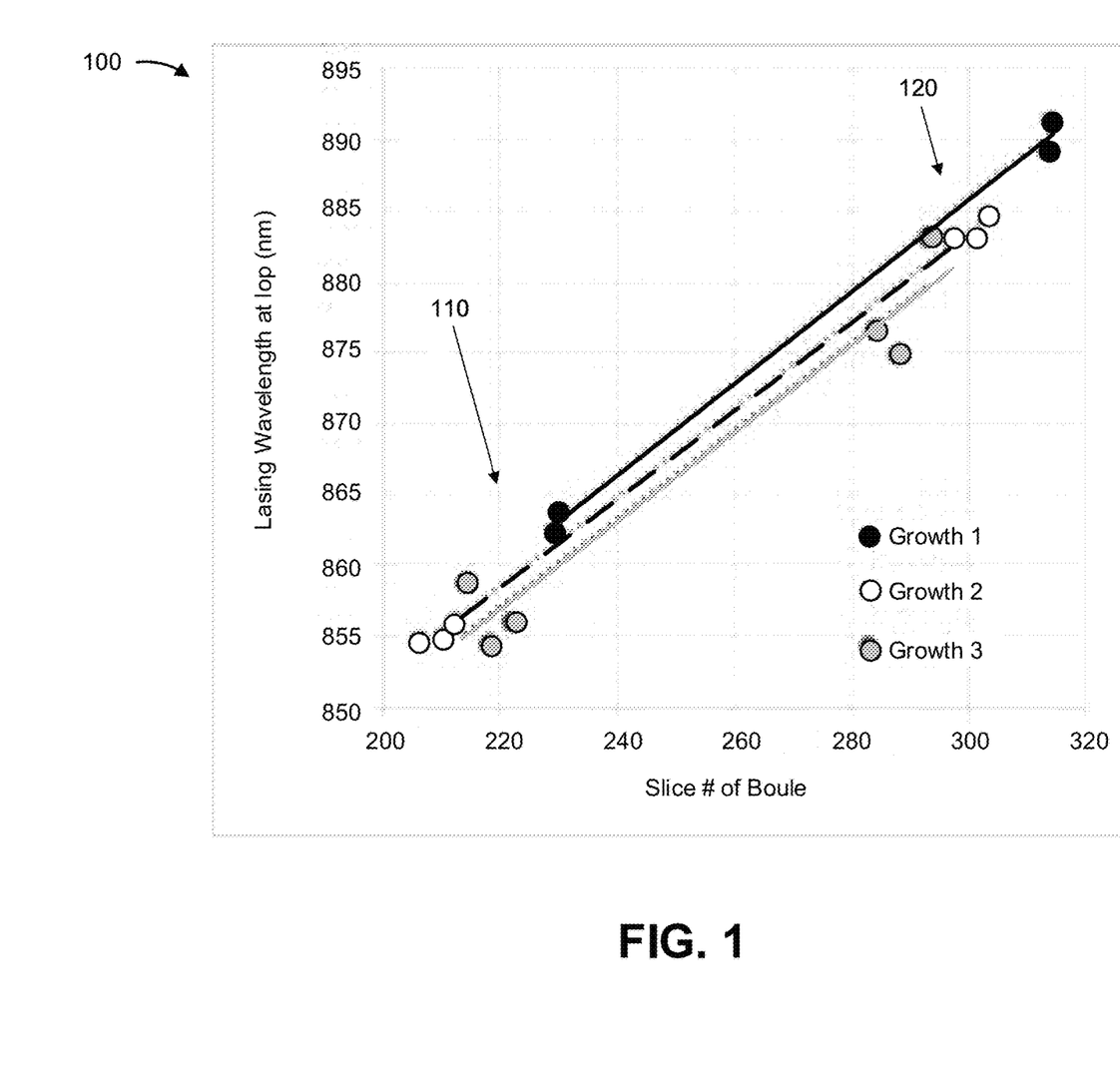
FIG. 1 is a diagram depicting a chart of a relationship between lasing wavelength and slice number of a boule for a prior semiconductor layer structure.

FIG. 1 is a diagram 100 depicting a chart of a relationship between lasing wavelength and slice number of a boule for a prior semiconductor layer structure. The chart shows this relationship for prior semiconductor lasers that include a prior semiconductor layer structure (e.g., that include a buffer layer with a thickness of about 0.4 μm). The chart shows a slice number of a boule ("Slice # of Boule") (e.g., a wafer or a substrate slice) on a first axis of the chart and lasing wavelength at an operation current ($I_{op}$) in nanometers on a second axis ("Lasing Wavelength at $I_{op}$ (nm)"). The chart shows various plots for different growth runs of a prior semiconductor layer structure (e.g., growth 1 through growth 3), where the plots represent corresponding slice numbers and lasing wavelengths for semiconductor lasers formed from various slices of a boule for each growth run. In addition, the chart shows a trend for the different growth plots for each growth run. As shown by reference number 110, regardless of growth run, lower slice numbers are correlated with lower lasing wavelengths. For example, and for growth 1 associated with the black circles and black trend line, a slice number of approximately 230 is correlated with a lasing wavelength of between 860 nm and 865 nm. As shown by reference number 120, regardless of growth run, higher slice numbers are correlated with higher lasing wavelengths. For example, and for growth 1, a slice number of approximately 315 is correlated with a lasing wavelength of between approximately 888 nm and approximately 891 nm. As a result, there can be a significant lasing wavelength variation between slices with a higher slice number and wafers with a lower slice number, even if the slices are from the same boule. For example, and for growth 1, the lasing wavelength variation is greater than 20 nm (and over 30 nm for some growth runs and between a low end of the growth runs and a high end of the growth runs). Depending on design needs, this wavelength variation can cause significant waste and can increase costs during production of semiconductor lasers. For example, and with regard to growth 1, if a lasing wavelength of between 875 nm and 895 nm is needed for a particular design, then only wafers with a slice number between approximately 264 and approximately 312 can be used to produce semiconductor lasers for the particular design. Slices with slice numbers that are out of this range are likely to produce semiconductor lasers that fail to have an adequate lasing wavelength and thus will need to be discarded or will need to be repurposed for a different design. As described below in connection with FIGS. 2-4, some implementations described herein reduce or eliminate this wavelength variability, thereby reducing or eliminating potential issues caused by the wavelength variability.

As indicated above, FIG. 1 is provided as an example. Other examples may differ from what is described with regard to FIG. 1.

Figure 2:
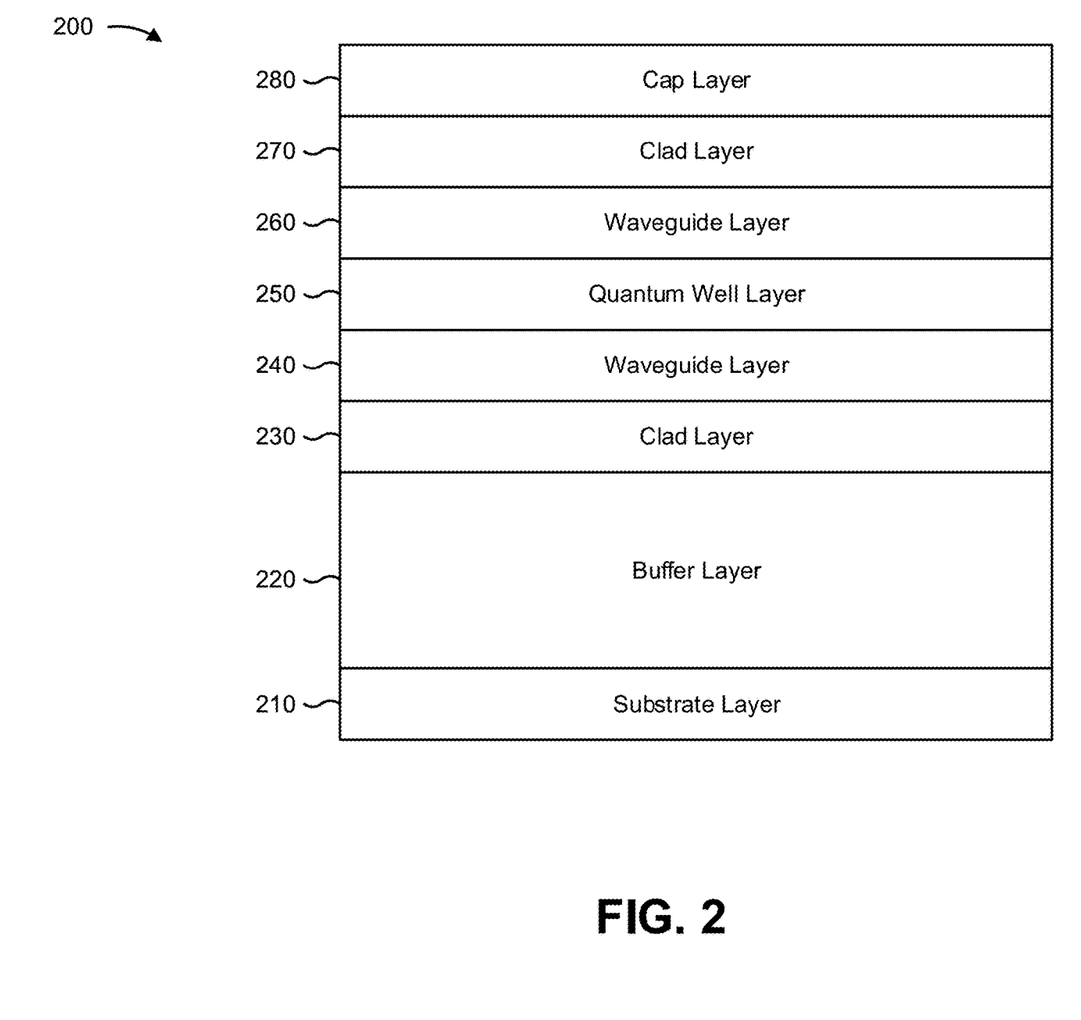
FIG. 2 is a diagram depicting an example implementation of a semiconductor layer structure with a thick buffer layer described herein.

FIG. 2 is a diagram depicting an example implementation 200 of a semiconductor layer structure with a thick buffer layer described herein.

As shown in FIG. 2, the semiconductor layer structure may include a substrate 210. For example, substrate 210 may be a gallium arsenide (GaAs) substrate and/or the like. Additionally, or alternatively, substrate 210 may be doped. For example, substrate 210 may be an n-doped substrate. Substrate 210 may be formed from a wafer (e.g., slice) from a boule and various other layers of the semiconductor layer structure may be formed (e.g., grown) on substrate 210.

As further shown in FIG. 2, the semiconductor layer structure may include a buffer layer 220. For example, buffer layer 220 may be formed on substrate 210. Buffer layer 220 may be a GaAs buffer layer and/or the like. Additionally, or alternatively, buffer layer 220 may be doped. For example, buffer layer 220 may be an n-doped buffer layer. In some implementations, buffer layer 220 may comprise a same material as substrate 210 (e.g., buffer layer 220 and substrate 210 may both comprise GaAs).

Buffer layer 220 may have a multiple micrometer thickness. For example, buffer layer 220 may have a thickness that is greater than or equal to 2 μm. In some implementations, as described below, buffer layer 220 may have a thickness that is approximately 4 μm across buffer layer 220 (e.g., that is between 3 μm and 5 μm across buffer layer 220, that has an average thickness of 4 μm across buffer layer 220, and/or the like).

Buffer layer 220 may be lattice matched to substrate 210. For example, substrate 210 and buffer layer 220 may have matching (e.g., nearly equal) lattice constants. This facilitates growth of buffer layer 220 on substrate 210 to the thickness described above and/or facilitates resistance of migration of defects in substrate 210 into buffer layer 220 and/or into various epitaxial layers formed on buffer layer 220 described below.

Various epitaxial layers may be formed on buffer layer 220. For example, the various epitaxial layers may include a first clad layer 230 (e.g., an n-clad layer) formed on buffer layer 220. The first clad layer 230 may form an n-type layer of a double heterostructure. As further shown in FIG. 2, the semiconductor layer structure may include a first waveguide layer 240 (e.g., an n-waveguide layer) formed on the first clad layer 230. The first waveguide layer 240 may guide electrons (or light) in a particular direction within a semiconductor laser formed from the semiconductor layer structure and/or may confine the electrons (or the light) to quantum well layer 250. As further shown in FIG. 2, the semiconductor layer structure may include a quantum well layer 250 formed on the first waveguide layer 240. As shown, a second waveguide layer 260 may be formed on quantum well layer 250. Quantum well layer 250 may function as an active region of the semiconductor laser. A quantum well intermixing region may be formed in association with quantum well layer 250 in certain regions of the semiconductor chip (not shown). The quantum well intermixing region may be intentionally formed in these regions by diffusion of a material (e.g., silicon atoms) from a surface of the wafer in these regions. During this intentional impurity diffusion, the wafer may be placed in a high temperature environment for a time until material may be diffused from some regions of a wafer surface to some regions of quantum well layer 250. Other regions of the wafer surface may be protected so that material from the wafer surface cannot diffuse to quantum well layer 250. In some implementations, these protected regions may be used as a semiconductor laser active region within a laser cavity.

As further shown in FIG. 2, the semiconductor layer structure may include the second waveguide layer 260 (e.g., a p-waveguide layer) formed on quantum well layer 250 and a second clad layer 260 (e.g., a p-clad layer) formed on the second waveguide layer 260. The second waveguide layer 260 may be similar to the first waveguide layer 240 and the first clad layer 230, respectively, except for being p-type layers rather than n-type layers. As further shown in FIG. 2, the semiconductor layer structure may include a cap layer 280. Cap layer 280 may be highly doped.

The semiconductor layer structure shown in and described with respect to FIG. 2 may be used to form various types of devices. For example, the semiconductor layer structure may be used to form a semiconductor laser (e.g., a semiconductor diode laser), a light-emitting device, and/or the like. In some implementations, a lasing wavelength of the device may be in an infrared (IR) or near-IR range (e.g., such as between 700 nm and 1000 nm). By including a thick buffer layer, the semiconductor layer structure shown in FIG. 2 provides improved control of lasing wavelength variability between different devices formed from different substrates 210 from a same boule (e.g., when lasing at an $I_{op}$ and at room temperature, such as approximately 21 degrees Celsius, or another temperature as set by a thermoelectric cooler (TEC)). In some implementations, lasing wavelengths of laser devices formed from different substrates 210 in the same boule may be measured under a same operational condition (e.g., a same current, a same heatsink temperature, and/or the like the like) in association with making this determination. For example, the improved control may maintain lasing wavelengths for devices formed from substrates with low slice numbers and devices formed from substrates with high slice numbers within a 20 nm range (e.g., when lasing wavelengths of the devices formed from the substrates with low slice numbers and the devices formed form the substrates with the high slice numbers are measured under the same operational condition). As such, the lasing wavelength may be substantially independent of a slice position or a slice number of substrate 210 in the boule (e.g., lasing wavelength control may facilitate use of devices formed from low slice numbers and/or high slice numbers depending on the intended application). In this context, a lasing wavelength being substantially independent of a slice position or slice number can be interpreted to mean that variation between the lasing wavelength and a lasing wavelength of another device formed from any other substrate of boule is less than a particular amount (e.g., 15 nm, 30 nm, or the like) regardless of slice positions or slice numbers of the pair of substrates.

In this way, some implementations described herein provide a semiconductor layer structure that includes a thick buffer layer. The thick buffer layer may reduce or eliminate migration of defects from substrate 210, which improves performance of devices formed using the semiconductor layer structure that include the thick buffer layer. In addition, the semiconductor layer structure that includes the thick buffer provides improved control of wavelength variability across devices formed from substrates 210 with different slice numbers from a boule. This improves production yield from a boule when using the boule to produce devices that lase within a narrow wavelength range (e.g., a range of 20 nm), thereby reducing costs and/or waste associated with device production.

As indicated above, FIG. 2 is provided merely as an example. Other examples may differ from what is described with regard to FIG. 2.

Figure 3:
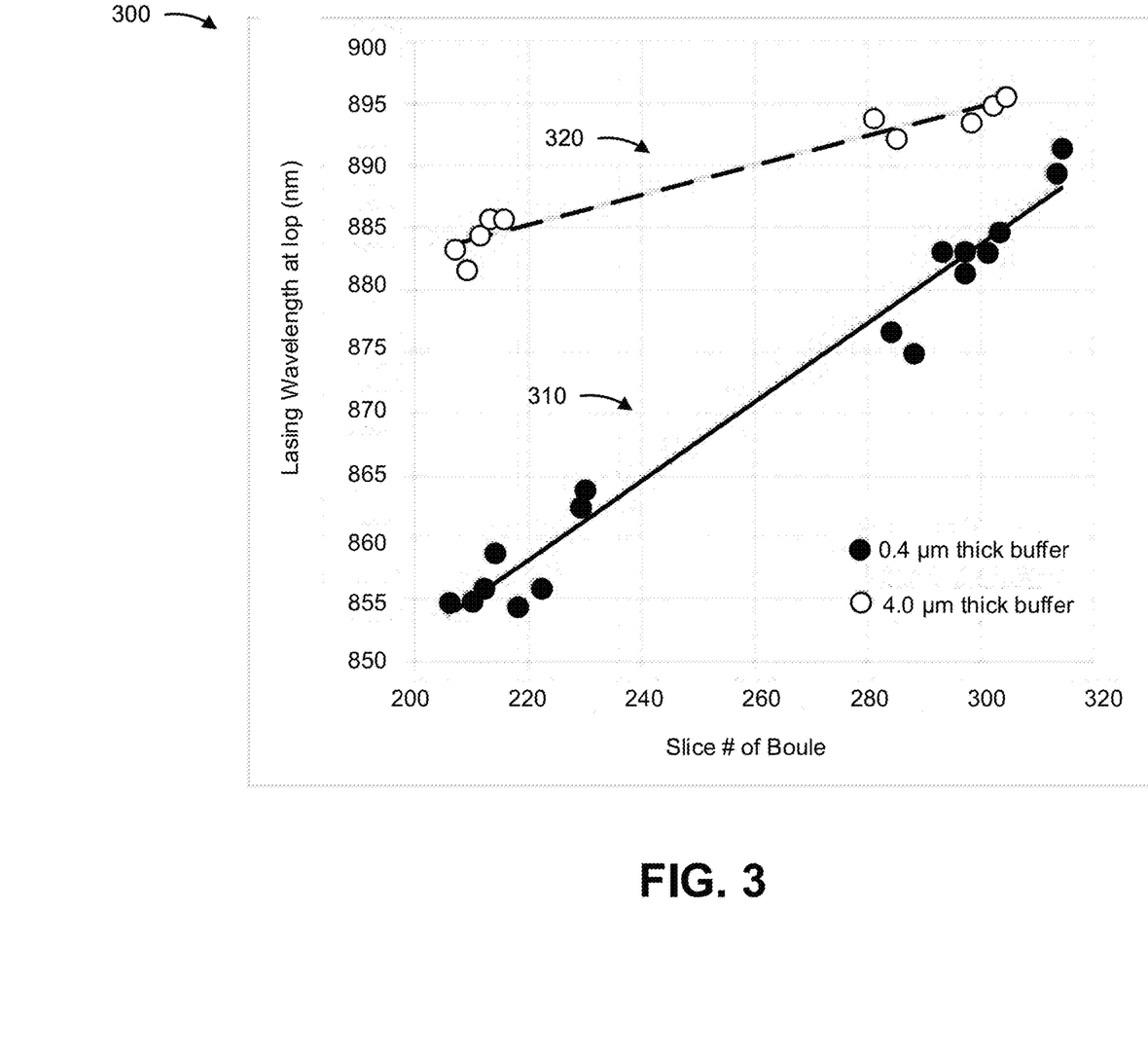
FIGS. 3 and 4 are diagrams depicting one or more charts comparing various thicknesses of a buffer layer and corresponding relationships between lasing wavelength and slice number of a boule for the various thicknesses.

FIG. 3 is a diagram 300 depicting a chart comparing various thicknesses of a buffer layer and corresponding relationships between lasing wavelength and slice number of a boule for the various thicknesses. For example, the chart shows a comparison of a relationship between lasing wavelength and slice number for a semiconductor layer structure that includes a 0.4 µm thick buffer layer and a semiconductor layer structure that includes a 4.0 µm thick buffer layer (e.g., a semiconductor layer structure that includes a thick buffer layer). The lasing wavelengths shown in the chart of FIG. 3 occur when corresponding devices are lasing at an operation current ($I_{op}$) and at room temperature.

Reference number 310 shows a plot for the semiconductor layer structure with a 0.4 µm thick buffer layer, as is typically used in prior semiconductor layer structures. As shown, the wavelength variation for devices formed from this semiconductor layer structure can be greater than 35 nm (e.g., from a low end of approximately 855 nm to a high end of approximately 892 nm). In some applications, this wavelength variation may be too large or may result in lasing wavelengths that are outside of an acceptable range.

Reference number 320 shows a plot for the semiconductor layer structure that includes a thick buffer layer (e.g., a 4.0 µm buffer layer). As shown, the wavelength variation for devices formed from this semiconductor layer structure that includes the thick buffer layer is less than 20 nm (e.g., from a low end of approximately 882 nm to a high end of approximately 897 nm). As a result, by using a thick buffer layer, a difference between lasing wavelengths corresponding to two different devices formed from substrates of a boule may be less than 20 nm. In this way, by reducing wavelength variability across devices formed from slices of a boule, the semiconductor layer structure that includes the thick buffer layer provides improved control of lasing wavelength, which reduces costs and waste, as described elsewhere herein.

As indicated above, FIG. 3 depicts one or more examples. Other examples may differ from what is described with regard to FIG. 3.

Figure 4:
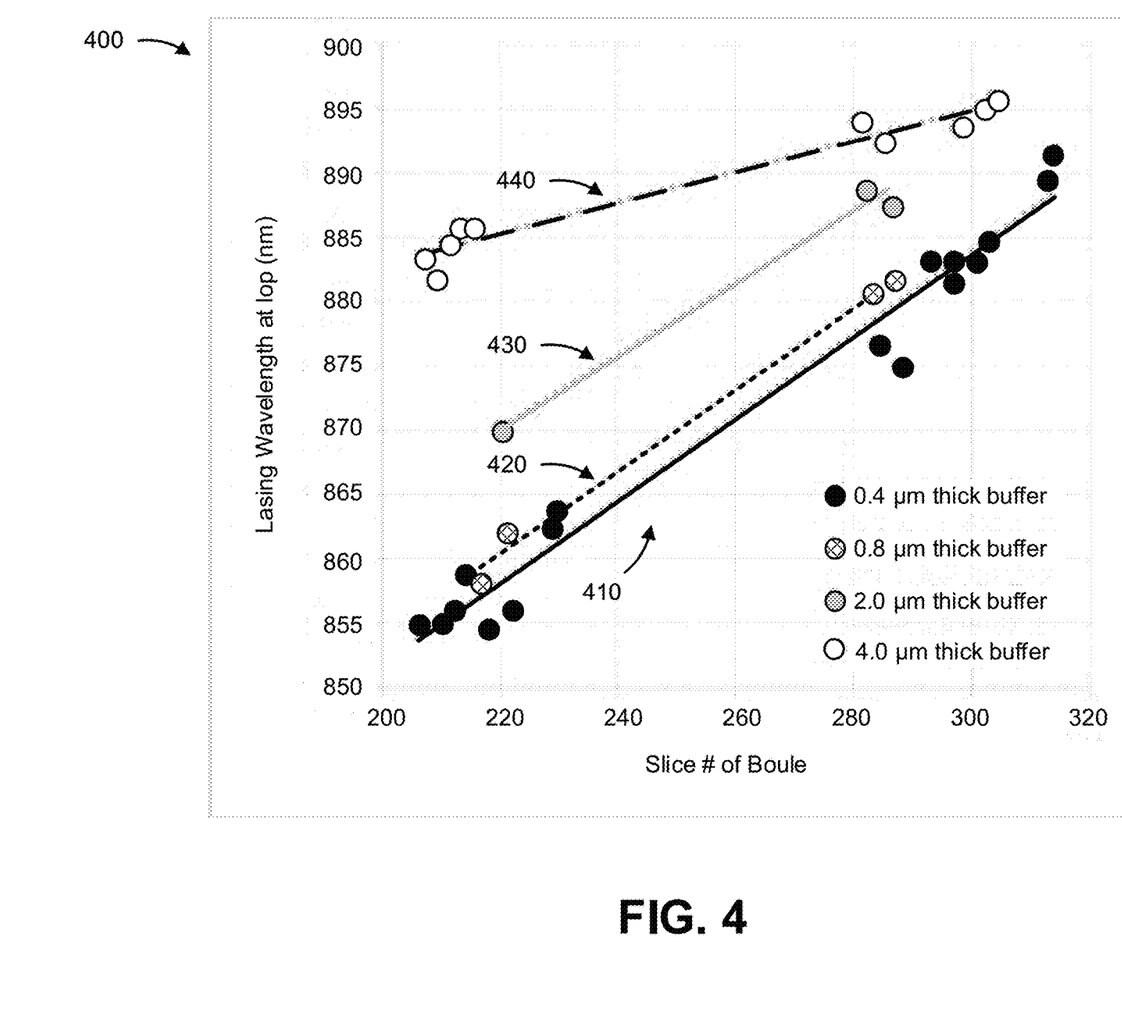

FIG. 4 is a diagram 400 depicting a chart comparing various thicknesses of a buffer layer and corresponding relationships between lasing wavelength and slice numbers of a boule for the various thicknesses. For example, the chart shows a comparison of a relationship between lasing wavelength and slice number for a semiconductor layer structure that includes a 0.4 µm thick buffer layer (e.g., as is typically used in prior semiconductor layer structures), a semiconductor layer structure that includes a 0.8 µm thick buffer layer, a semiconductor layer structure that includes a 2.0 µm thick buffer layer, and a semiconductor layer structure that includes a 4.0 µm thick buffer layer. The lasing wavelengths shown in the chart of FIG. 4 occur when corresponding devices are lasing at an operation current ($I_{op}$) and at room temperature, similar to that described elsewhere herein.

Reference number 410 shows the same plot as that shown with respect to reference number 310 of FIG. 3 for a semiconductor layer structure that includes a buffer layer that is 0.4 µm thick. Reference number 420 shows a plot for a semiconductor layer structure that includes a buffer layer that is 0.8 µm thick. As shown, the wavelength variability across devices formed from different slices of a boule is still greater than 20 nm (e.g., from a low end of approximately 858 nm to a high end of approximately 882 nm). In addition, for some applications that need lasing wavelengths of between 875 nm and 895 nm (as a specific example), more than half of the devices associated with the 0.8 µm and the 0.4 µm example fail to have a lasing wavelength within that range, resulting in a greater than 50 percent loss rate when buffer layers with 0.4 µm or 0.8 µm thicknesses are used.

Reference number 430 shows a plot for a semiconductor layer structure that includes a 2.0 µm thick buffer layer. As shown, the wavelength variability across devices formed from different slices of a boule is less than 20 nm (e.g., from a low end of approximately 870 nm to a high end of approximately 889 nm). In this example, and for the applications mentioned above (e.g., that need lasing wavelengths of between 875 nm and 895 nm), two of the three devices may be suitable for those applications, thereby resulting in only a 33.33 percent loss. In this way, a device with a 2.0 thick buffer layer may provide improved wavelength control relative to a device that includes a buffer layer that is 0.8 µm thick or that is 0.4 µm thick. Reference number 440 shows a plot for a semiconductor layer structure that includes a 4.0 µm thick buffer layer. As shown, the 4.0 µm thick buffer layer provides improved wavelength variability control relative to the 2.0 µm thick buffer layer. For example, for an application where lasing wavelengths between 875 nm and 895 nm are needed, nine of the 10 devices have a lasing wavelength within that range, resulting in only a 10 percent loss. In this way, a device with a thick buffer layer (e.g., a multi-micron-thick buffer layer) may reduce wafer-by-wafer lasing wavelength variation. For example, a wafer-by-wafer lasing wavelength variation is reduced from 37 nm for a 0.4 µm thick buffer layer to 14 nm for a 4.0 µm thick buffer layer.

As indicated above, FIG. 4 is provide merely as an example. Other examples may differ from what is described with regard to FIG. 4.

Figure 5:
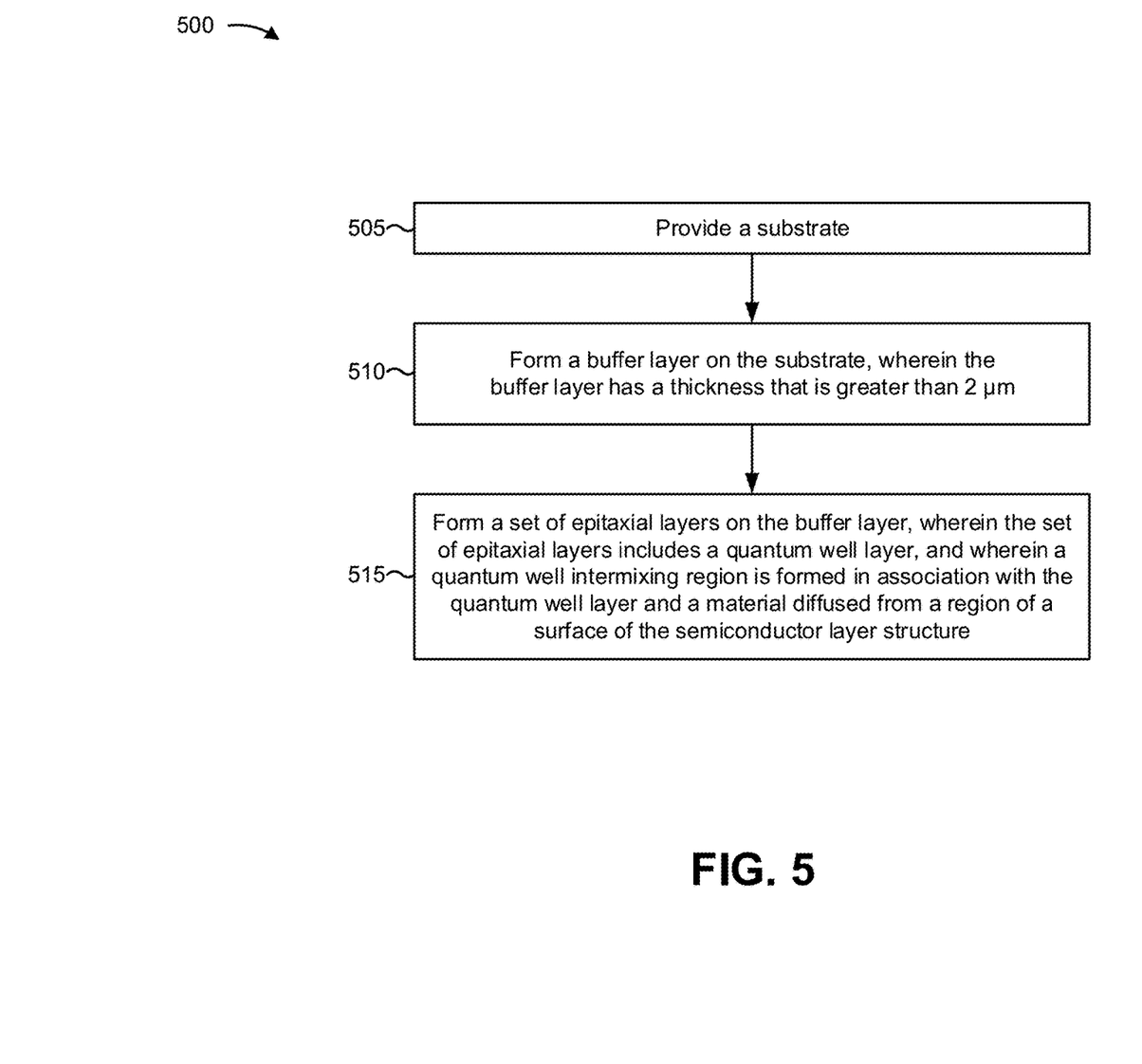
FIG. 5 is a flow chart of an example process for forming a semiconductor layer structure with a thick buffer layer described herein.

FIG. 5 is a flow chart of an example process 500 for forming a semiconductor layer structure with a thick buffer layer.

As shown in FIG. 5, process 500 may include providing a substrate (block 505). For example, substrate 210 may be provided, as described above.

As further shown in FIG. 5, process 500 may include forming a buffer layer on the substrate (block 510). For example, buffer layer 220 may be formed on substrate 210, as described above. In some aspects, buffer layer 220 has a thickness that is greater than 2 µm.

As further shown in FIG. 5, process 500 may include forming a set of epitaxial layers on the buffer layer (block 515). For example, set of epitaxial layers may be formed on buffer layer 220, as described above. In some aspects, the set of epitaxial layers includes quantum well layer 250. In some aspects, a quantum well intermixing region is formed in association with quantum well layer 250 and a material diffused from a region of a surface of the semiconductor layer structure.

Process 500 may include additional implementations, such as any single implementation or any combination of implementations described below and/or in connection with one or more other processes described elsewhere herein.

In some implementations, the semiconductor layer structure is included in a laser device. In some implementations, the laser device has a lasing wavelength of in an infrared (IR) or near-IR range. In some implementations, a lasing wavelength of the laser device is substantially independent of a slice position of the substrate from a boule.

In some implementations, the buffer layer comprises a same material as the substrate. In some implementations, the buffer layer has a thickness of between 2 µm and 5 µm. In some implementations, the thickness is an average of 4 µm across the buffer layer. In some implementations, the buffer layer is an n-doped buffer layer. In some implementations, an n-doped clad layer, of the set of epitaxial layers, is formed on the n-doped buffer layer. In some implementations, the quantum well layer is formed on the n-doped clad layer.

Although FIG. 5 shows example blocks of process 500, in some implementations, process 500 may include additional blocks, fewer blocks, different blocks, or differently arranged blocks than those depicted in FIG. 5. Additionally, or alternatively, two or more of the blocks of process 500 may be performed in parallel.

The foregoing disclosure provides illustration and description, but is not intended to be exhaustive or to limit the implementations to the precise forms disclosed. Modifications and variations may be made in light of the above disclosure or may be acquired from practice of the implementations.

As used herein the term "layer" is intended to be broadly construed as one or more layers and includes layers oriented horizontally, vertically, or at other angles.

Some implementations are described herein in connection with thresholds. As used herein, satisfying a threshold may, depending on the context, refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A semiconductor layer structure, comprising:
   a substrate;
   a single buffer layer formed on and in contact with the substrate,
      wherein the single buffer layer has a thickness that is greater than 2 micrometers (μm);
   a first clad layer formed on and in contact with the single buffer layer;
   a first waveguide layer formed on and in contact with the first clad layer;
   a quantum well layer formed on and in contact with the first waveguide layer,
      wherein a quantum well intermixing region is formed in association with the quantum well layer and a material diffused from a region of a surface of the semiconductor layer structure;
   a second waveguide layer formed on and in contact with the quantum well layer;
   a second clad layer formed on and in contact with the second waveguide layer; and
   a cap layer formed on and in contact with the second clad layer.

2. The semiconductor layer structure of claim 1, wherein the semiconductor layer structure is included in a laser device.

3. The semiconductor layer structure of claim 2, wherein the laser device has a lasing wavelength in an infrared (IR) or near-IR range.

4. The semiconductor layer structure of claim 3, wherein the lasing wavelength is substantially independent of a slice position or a slice number of the substrate from a boule.

5. The semiconductor layer structure of claim 1, wherein the single buffer layer comprises a same material as the substrate.

6. The semiconductor layer structure of claim 1, wherein the single buffer layer has a thickness of between 2 μm and 5 μm.

7. A semiconductor laser, comprising:
   a substrate;
   a single buffer layer formed on and in contact with the substrate,
      wherein the single buffer layer has a thickness that is between 2 micrometers (μm) and 5 μm;
   a first clad layer formed on and in contact with the single buffer layer;
   a first waveguide layer formed on and in contact with the first clad layer;
   a quantum well layer formed on and in contact with the first waveguide layer,
      wherein a quantum well intermixing region is formed within the quantum well layer by a material diffused from a region of a surface of a semiconductor layer structure using quantum well intermixing;
   a second waveguide layer formed on and in contact with the quantum well layer;
   a second clad layer formed on and in contact with the second waveguide layer; and
   a cap layer formed on and in contact with the second clad layer.

8. The semiconductor laser of claim 7, wherein the semiconductor laser and another semiconductor laser formed using another substrate from a same boule as the substrate have a lasing wavelength variation of less than 20 nanometers (nm).

9. The semiconductor laser of claim 8, wherein a lasing wavelength of the semiconductor laser and a lasing wavelength of the other semiconductor laser are measured under a same operational condition.

10. The semiconductor laser of claim 8, wherein lasing wavelengths corresponding to the semiconductor laser and the other semiconductor laser are in an infrared (IR) or near IR range.

11. The semiconductor laser of claim 10, wherein the lasing wavelengths corresponding to the semiconductor laser and the other semiconductor laser occur when the semiconductor laser and the other semiconductor laser are lasing at room temperature.

12. The semiconductor laser of claim 7, wherein the single buffer layer is an n-doped buffer layer.

13. The semiconductor laser of claim 12, wherein the first clad layer is an n-doped clad layer formed on the n-doped buffer layer, wherein the quantum well layer is formed on the n-doped clad layer.

14. The semiconductor laser of claim 7, wherein the thickness is an average of 4 μm across the single buffer layer.

15. An optical device, comprising:
   a substrate;
   a single buffer layer formed on and in contact with the substrate,
      wherein the single buffer layer has a thickness that averages 4 micrometers (μm) across the single buffer layer;
   a first clad layer formed on and in contact with the single buffer layer;
   a first waveguide layer formed on and in contact with the first clad layer;
   a quantum well layer formed on and in contact with the first waveguide layer,
      wherein a quantum well intermixing region is formed within the quantum well layer by a material diffused from a region of a surface of a semiconductor layer structure using quantum well intermixing;
   a second waveguide layer formed on and in contact with the quantum well layer;
   a second clad layer formed on and in contact with the second waveguide layer; and
   a cap layer formed on and in contact with the second clad layer.

16. The optical device of claim 15, wherein the single buffer layer is an n-doped buffer layer.

17. The optical device of claim 15, wherein the single buffer layer is a gallium arsenide (GaAs) buffer layer.

18. The optical device of claim 15, wherein a difference between a lasing wavelength of the optical device and another lasing wavelength of another optical device is less than 20 nm,
   wherein the substrate for the optical device and another substrate for the other optical device are associated with a same boule.

19. The optical device of claim 18, wherein the lasing wavelength and the other lasing wavelength are in an infrared (IR) or near-IR range.

20. The optical device of claim 18, wherein the lasing wavelength and the other lasing wavelength occur during lasing at an operation current ($I_{op}$) and at room temperature.

* * * * *